United States Patent
Zhao et al.

(10) Patent No.: US 10,243,443 B2
(45) Date of Patent: Mar. 26, 2019

(54) BIAS VOLTAGE GENERATOR FOR N-CHANNEL BASED LINEAR REGULATOR

(71) Applicant: Analog Devices, Inc., Norwood, MA (US)

(72) Inventors: Jun Zhao, Fremont, CA (US); Brandon Day, Seattle, WA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/072,059

(22) Filed: Mar. 16, 2016

(65) Prior Publication Data

US 2017/0271972 A1   Sep. 21, 2017

(51) Int. Cl.
| | |
|---|---|
| *H02M 1/00* | (2006.01) |
| *G05F 1/10* | (2006.01) |
| *H02M 3/156* | (2006.01) |
| *H02M 1/088* | (2006.01) |
| *G05F 1/56* | (2006.01) |
| *G05F 1/563* | (2006.01) |
| *H03F 1/02* | (2006.01) |
| *H02M 3/155* | (2006.01) |

(52) U.S. Cl.
CPC ............. *H02M 1/088* (2013.01); *G05F 1/56* (2013.01); *G05F 1/563* (2013.01); *H02M 3/155* (2013.01); *H03F 1/0261* (2013.01); *H02M 2001/0045* (2013.01)

(58) Field of Classification Search
CPC ... H02M 2001/0025; H02M 2001/007; H02M 2001/008; H02M 1/08; H02M 1/088; H02M 3/07; H02M 3/156; H02M 3/158; H02M 3/1588; H02M 2001/0045
USPC ........ 323/234, 265, 268, 270, 282, 284, 288
See application file for complete search history.

(56) References Cited

U.S. PATENT DOCUMENTS

| | | | |
|---|---|---|---|
| 7,429,850 B1 | 9/2008 | Wochele | |
| 8,502,516 B2 * | 8/2013 | Shieh ................. | H02M 3/1588 323/222 |
| 2002/0079948 A1 * | 6/2002 | Moriconi .............. | H02M 3/155 327/390 |
| 2007/0024261 A1 * | 2/2007 | Wong .................. | H02M 3/1588 323/288 |

(Continued)

*Primary Examiner* — Timothy J Dole
*Assistant Examiner* — David A. Singh
(74) *Attorney, Agent, or Firm* — Schwegman Lundberg & Woessner, P.A.

(57) ABSTRACT

Apparatus and methods for a bias supply circuit to support power supply including a switched-mode voltage converter cascaded with an n-channel-based linear regulator are provided. In an example, a cascaded power supply system can include a switched-mode DC-to-DC power converter, including an input voltage node, a first stage output voltage node, and a bootstrapped floating bias voltage node, and a linear regulator circuit. The linear regulator circuit can include an n-channel field-effect transistor (NFET) pass transistor, including a drain terminal coupled to the first stage output voltage node, a gate terminal, and a source terminal configured to provide a second-stage output voltage, and a gate driver circuit, including a driver output coupled to the gate terminal of the NFET pass transistor, and a high side supply node configured to receive a bias voltage generated from the bootstrapped floating bias voltage node.

16 Claims, 4 Drawing Sheets

(56) References Cited

U.S. PATENT DOCUMENTS

| | | | | |
|---|---|---|---|---|
| 2007/0210775 A1* | 9/2007 | Bothra | ............... | H02M 3/158 |
| | | | | 323/283 |
| 2008/0278085 A1* | 11/2008 | Yu | ............... | H05B 41/295 |
| | | | | 315/224 |
| 2011/0012576 A1* | 1/2011 | Goto | ............... | H02M 3/156 |
| | | | | 323/282 |
| 2012/0049829 A1* | 3/2012 | Murakami | ............ | H02M 1/32 |
| | | | | 323/288 |
| 2015/0364928 A1* | 12/2015 | Yen | ............... | H04B 5/0037 |
| | | | | 320/108 |

* cited by examiner

BIAS VOLTAGE GENERATOR FOR N-CHANNEL BASED LINEAR REGULATOR

BACKGROUND

Electronic systems can include components that rely on a regulated power source. Power converter circuitry can be used to provide a circuit supply rail having the regulated voltage. Linear regulators, sometimes called LDOs employ one method of providing a regulated voltage for electronic systems. Linear regulators can provide both high power supply rejection ratio (PSRR) and low output noise performance, and are widely used to power up noise sensitive rails, such as, but not limited to, power rails for analog-to-digital converters (ADCs), digital-to-analog converters (DACs) and radio frequency (RF) circuits. (e.g. ADC, DAC, RF, etc.) DC-to-DC switched-mode voltage converters can also be used to provide a regulated DC voltage. DC-to-DC switched-mode voltage converters can usually provide better efficiency compared to an LDO. In order to capture the advantages of both systems, some popular analog signal-chain system power designs combine a DC-to-DC switched-mode voltage converter with an LDO.

As the signal-chain systems continue to evolve, more complexity systems have been packed into smaller solution sizes. In addition, integrated circuit core supply voltages have been moving down in order to save the power consumption in the evolving low geometry process. However, use of traditional P-Channel linear regulators has become more difficult as the lower input voltages do not provide enough gate turn-on voltage.

Overview

This overview is intended to provide an overview of subject matter of the present patent application. It is not intended to provide an exclusive or exhaustive explanation of the present subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
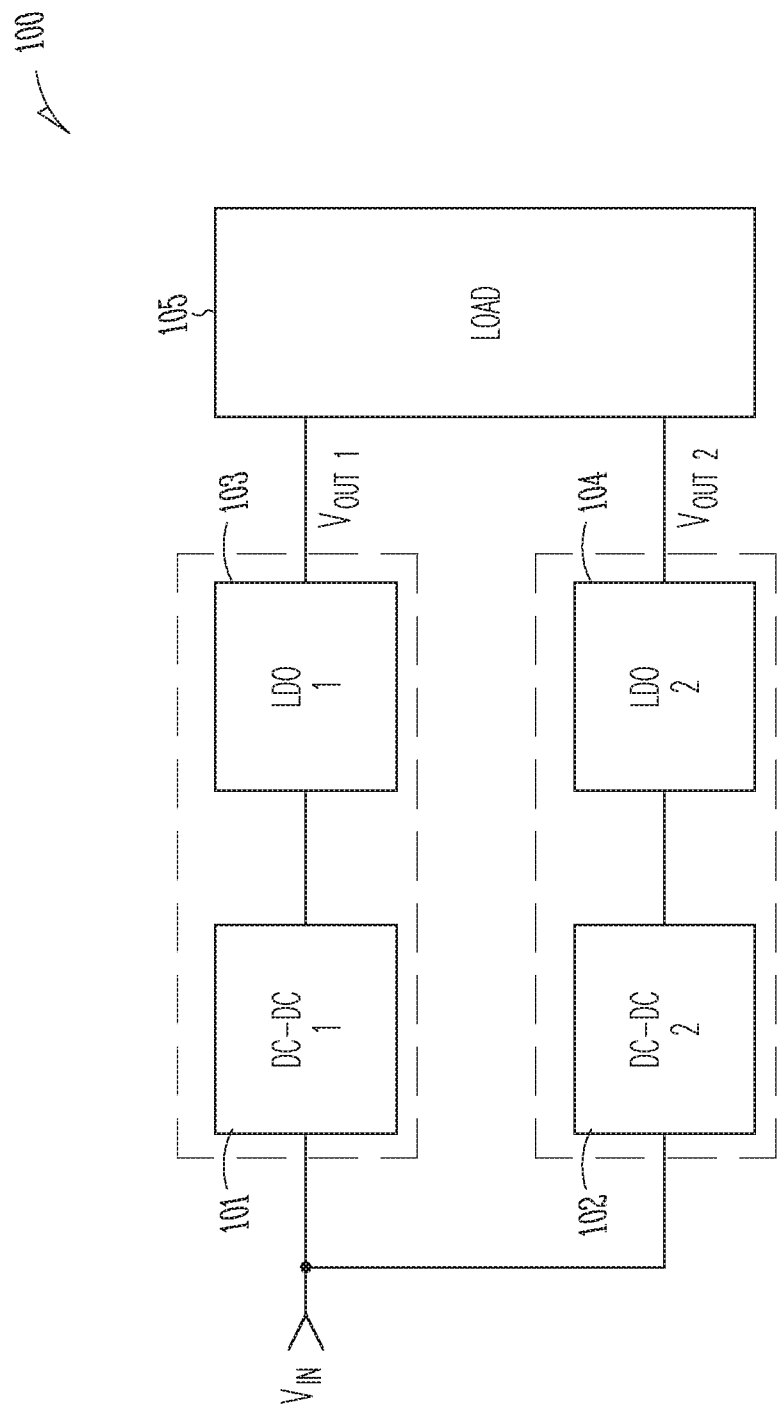
FIG. 1 illustrates generally an example of a cascaded DC-to-DC switched-mode voltage converter and linear regulator forming a voltage supply system for an electronic device.

FIG. 1 illustrates generally an example of a cascaded DC-to-DC switched-mode voltage converter 101, 102 and linear regulator 103, 104 forming a voltage supply system 100 for an electronic device. The voltage supply system 100 can include first switched-mode voltage converter 101 cascaded a first linear regulator 103 to provide a first output voltage ($V_{OUT1}$) and a second switched-mode voltage converter 102 cascaded with a second linear regulator 104 to provide a second output voltage ($V_{OUT2}$). Although not limited as such, the system can provide clean 1.0V and 3.3V voltage supplies for a load 105 such as an analog load that may include analog-to-digital converters (ADCs), digital-to-analog converters (DACs), radio frequency components, etc. The DC-to-DC switched-mode voltage converters 101, 102 can provide post regulation supplies of 3.8 volts from the first switched-mode voltage converter 101 and 1.2V from the second switched-mode voltage converter 102. The outputs of the switched-mode voltage converters 101, 102 feed into the respective linear regulator 103, 104 to get the regulated 3.3V ($V_{OUT1}$) and 1.0V ($V_{OUT2}$) supply voltages. As configured, the linear regulators 103, 104 operate in low voltage headroom (VIN−VOUT=200 mV/500 mV) in order to maximize the system efficiency. It is understood that other supply voltages and output voltage combinations of each switch mode voltage converter and linear regulator combination are possible without departing from the scope of the present subject matter.

Figure 2:
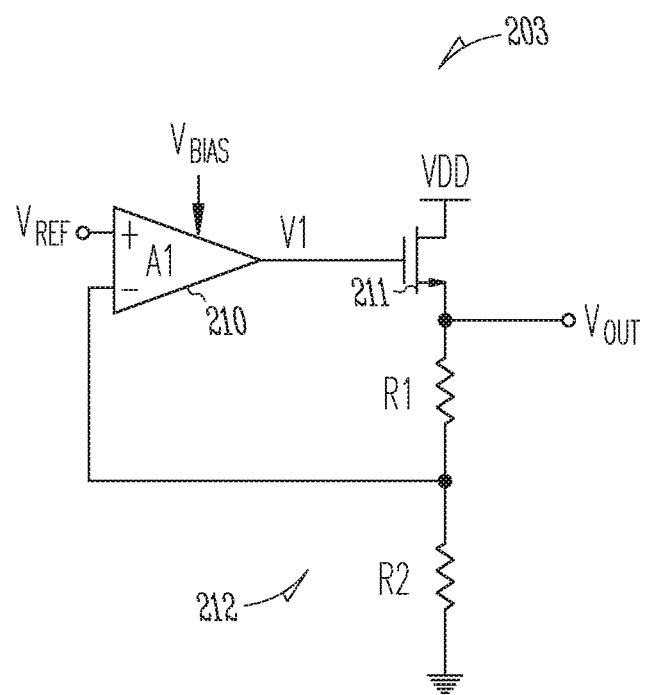
FIG. 2 shows an n-channel transistor based linear regulator.

The input voltage of the second linear regulator 104 is configured to be as low and as close as to the 1.0V output to keep small headroom and increase the efficiency of the second linear regulator 104. However, traditional p-channel transistor based linear regulators become more difficult to support lower input voltages due to not enough gate turn-on voltage. An option to p-channel-based regulators is the possibility of a linear regulator that uses an n-channel transistor to provide the output voltage. FIG. 2 shows an n-channel transistor based linear regulator 203 that can include gate drive amplifier 210, an n-channel transistor 211, such as an n-channel field-effect transistor (NFET), and a feedback network 212. In certain examples, a linear regulator with an n-channel transistor can allow for very low input voltage operation, and can have better PSRR performance due to its source follower structure. However, an n-channel based linear regulator can employ a bias gate driving voltage ($V_{bias}$) that is higher than the output voltage ($V_{out}$) to allow for better regulation. In some applications, an external bias voltage supply, that increases the complexity of the voltage supply system, can be provided in order to fully regulate the output supply voltage of linear regulator. In certain applications, where the input voltage is higher than the output voltage, the bias voltage for the n-channel based linear regulator can be provided by the input voltage. The present inventors have recognized that there are still corner applications such as that shown in FIG. 1 where providing 3.3 volts from a 5 volt supply, for example, does not provide enough bias voltage for an n-channel linear regulator when tolerances are taken into consideration. Such applications can include an additional bias supply to enable operation of the n-channel based linear regulator in a combined DC-to-DC switched-mode voltage converter and linear regulator circuit.

Figure 3:
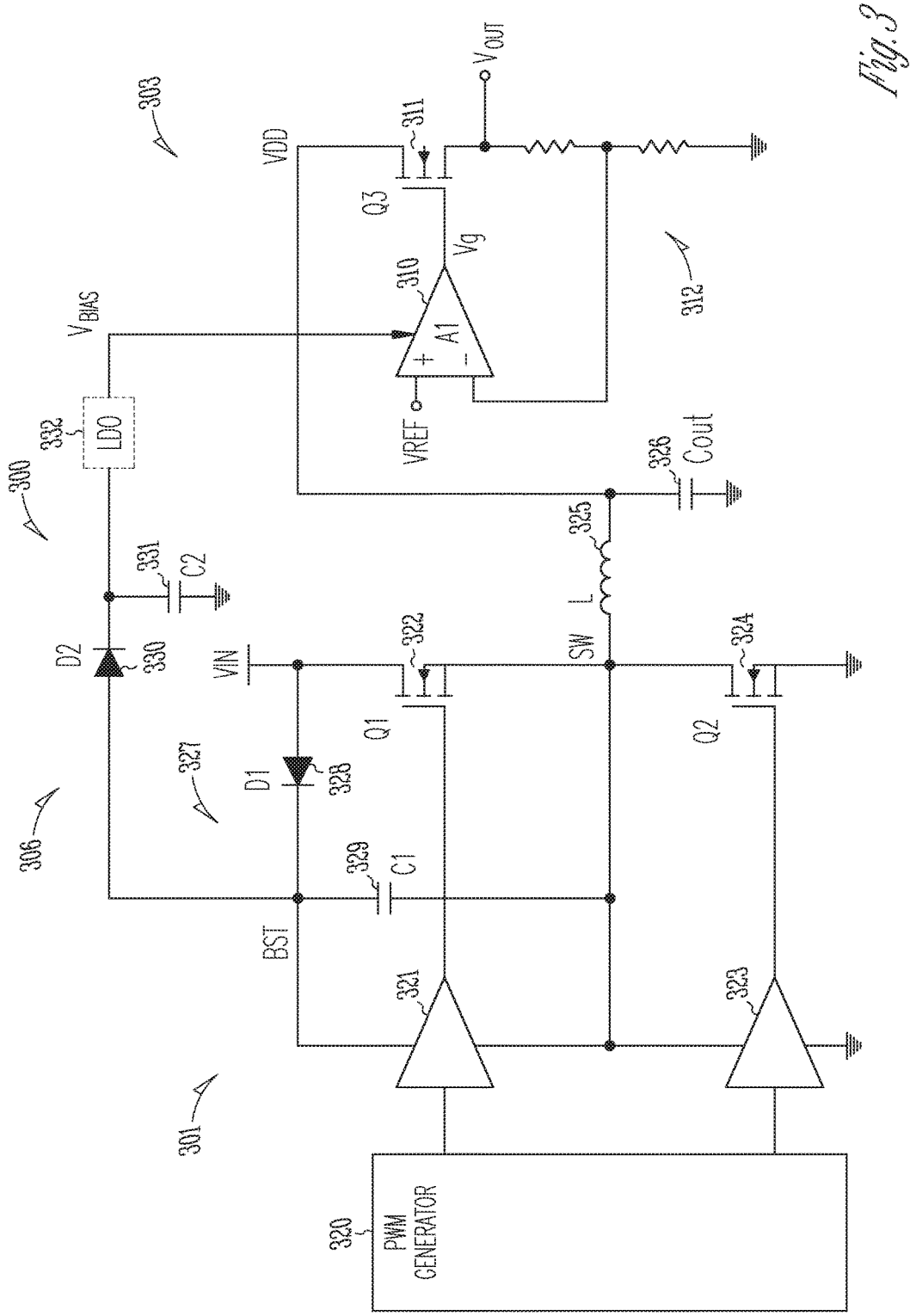
FIG. 3 illustrates generally a power supply including an n-channel based linear regulator cascaded with a DC-to-DC switched-mode voltage converter that includes a bias voltage generator for the n-channel based linear regulator according to various examples of the present subject matter.

The present inventors have also recognized apparatus and methods that can provide a very elegant yet simple solution for applications where the input supply voltage falls short for providing a sufficient bias voltage for an n-channel linear regulator cascaded with a DC-to-DC switched-mode voltage converter. FIG. 3 illustrates generally a power supply circuit 300 including a second stage, n-channel based linear regulator 303 cascaded with a first stage, DC-to-DC switched-mode voltage converter 301 that includes a bias voltage generator 306 for the n-channel based linear regulator 303. In certain examples, the DC-to-DC switched-mode voltage converter 301 can include a controller 320, a high side driver 321, a high side transistor 322, a low side driver 323, a low side transistor 324, an inductor 325, an output capacitor 326 and a bootstrap circuit 327 including a bootstrap diode 328 and bootstrap capacitor 329. In certain examples, the linear regulator 303 can include a gate drive amplifier 310, an n-channel transistor 311 providing an output voltage ($V_{OUT}$), and a feedback network 312.

In certain examples, the bias voltage generator 306 can include a bias diode 330 and a bias capacitor 331 coupled in-series between an intermediate node (BST) of the bootstrap circuit 327 of the DC-to-DC switched-mode voltage converter 301 and ground.

When the DC-to-DC switched-mode voltage converter is enabled, the low-side transistor (Q2) 324 can be turned on or placed in a first state and a switch node (SW) can be pulled to ground. As a result, the bootstrap capacitor (C1) 329 can charge up to the input voltage level ($V_{IN}$) through the bootstrap diode (D1) and can provide a bias voltage for the high side driver 321 and the low side driver 323 of the DC-to-DC switched-mode voltage converter 301. When the low-side transistor (Q2) 324 begins to turn off, or placed in a second state, the high-side transistor 322 (Q1) can begin to turn on. As the low-side transistor 324 (Q2) enters the second state, the switch node (SW) can be isolated from ground. As the high-side transistor 322 (Q1) turns on, the switch node (SW) can rise up to the input voltage level ($V_{IN}$) forcing the intermediate node (BST) voltage level to be about $V_{IN}+V_{C1}$, where $V_{C1}=V_{IN}-V_D$). The switch control 320 of the DC-to-DC switched-mode voltage converter 301 can then repeat the pattern by turning off the high-side transistor (Q1) 322 and turning on the low-side transistor (Q2) 324.

The present inventors have recognized that since the bootstrap circuitry 327 in DC-to-DC switched-mode voltage converter 301 already provides a floating bias voltage for the DC-to-DC switched-mode voltage converter itself, the same bootstrap circuitry 327 can be re-used to generate a fixed bias supply voltage ($V_{bias}$) with reference to ground or to a low side supply node of the gate drive amplifier 310. In certain examples, repurposing the bootstrap circuit 327 to provide the bias voltage ($V_{bias}$) can include an elegant but simple diode and capacitor circuit. The bias diode (D2) 330 and bias capacitor (C2) 331 can be coupled to the intermediate node (BST) of the DC-to-DC switched-mode voltage circuit 301 to rectify the bootstrap capacitor (C1) voltage to be a substantially fixed, bias voltage ($V_{bias}$), which can be referenced to ground or to a low side supply node of the gate drive amplifier 310. In certain examples, as the high-side transistor 322 (Q1) turns on and the switch node (SW) rises up to the input voltage level ($V_{IN}$) forcing the intermediate node (BST) voltage level to be about $V_{IN}+V_{C1}$, charge of the bootstrap capacitor 329 can be transferred to the bias capacitor 331 via the bias diode 330. IN certain examples, the voltage across the bias capacitor 331 can be provided as a bias voltage ($V_{bias}$). The bias voltage ($V_{bias}$) can be used to supply the gate driver amplifier 310 of an n-channel transistor 311 in the n-channel based linear regulator 303. In certain examples, the bias voltage ($V_{bias}$) is estimated as $2*V_{IN}-2*V_D$, where $V_{IN}$ is the supply voltage of power supply circuit 300 and $V_D$ is the average voltage across the bootstrap diode (D1) 328 and the bias diode (D2) 330. In some examples, an optional linear regulator 332 can be added to improve noise characteristics and PSRR of the bias voltage ($V_{bias}$).

The operation frequency of bootstrap circuitry can be the same as the fundamental DC-to-DC switching frequency, so the linear regulator output noise spurs caused by the bias supply voltage generator 306 can have the same frequency as the DC-to-DC switching frequency. The noise spurs can overlap with fundamental voltage ripple of linear regulator input voltage ($V_{DD}$) coming from DC-to-DC switched-mode voltage converter output. As such, the noise spurs are typically high frequency and can be easily filtered by an additional LC filter. A bias voltage generator 306 according to the present subject matter reduces the need for an additional power source in some applications and is very low cost as the most basic example adds only a diode (D2) and a capacitor (C2) to a cascaded power supply as illustrated in FIG. 3. In certain examples, the voltage available at the intermediate node (BST) of the DC-to-DC switched-mode voltage converter 301 is about $2*V_{IN}-V_D$. In certain examples, the bias voltage (Vbias) generated can be about $2*Vin-2*V_D$, which is high enough to provide full control of a n-channel based linear regulator even in examples with an optional linear regulator inserted in the bias supply voltage processing path for noise clean-up.

Figure 4:
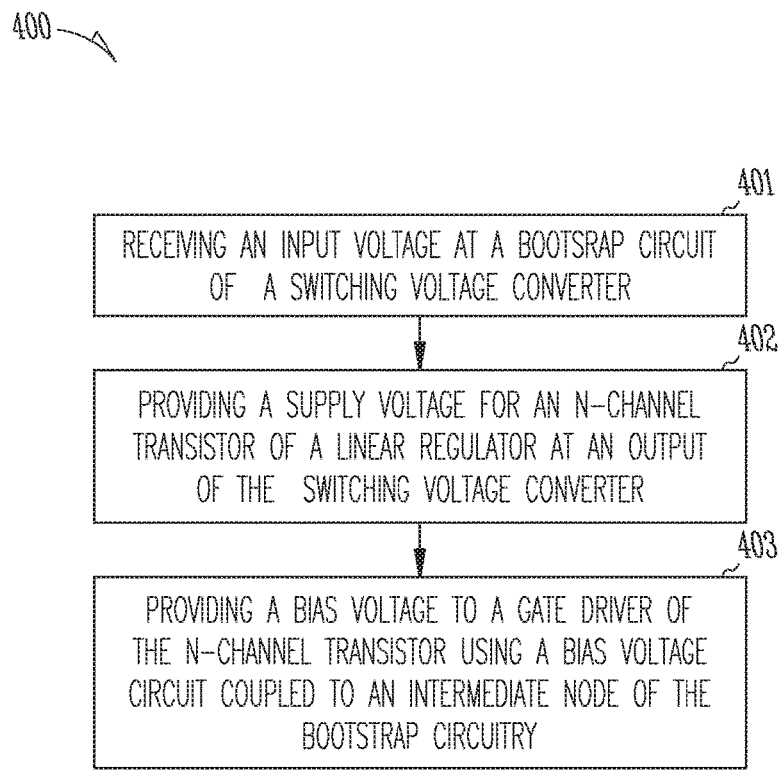
FIG. 4 illustrates generally a flowchart of a method for providing bias voltage for an n-channel based linear regulator of a power supply, where the n-channel based linear regulator is cascaded with a DC-to-DC switched-mode voltage converter according to various examples of the present subject matter.

FIG. 4 illustrates generally a flowchart of a method for providing bias voltage for an n-channel based linear regulator of a power supply, where the n-channel based linear regulator is cascaded with a DC-to-DC switched-mode voltage converter according to various examples of the present subject matter. The method 400, at 401, can include receiving an input voltage of the power supply at a bootstrap circuit of the switched-mode voltage converter. In certain examples, the bootstrap circuit can provide bias voltage for drivers of the switched-mode voltage converter. At 402, an output of the switched-mode voltage converter can provide a supply voltage for the n-channel pass transistor of the n-channel based linear regulator. In certain examples, the supply voltage can be coupled directly to the drain terminal of the n-channel pass transistor. At 403, a bias voltage for a gate driver of the n-channel pass transistor can be provided using a bias voltage circuit coupled to an intermediate node of the bootstrap circuit. In certain examples, the bias voltage circuit can rectify a voltage of the intermediate node of the bootstrap circuit to provide a bias voltage that is higher than the input voltage to the power supply. In some examples, the bias voltage circuit can include a linear regulator to provide better noise and PSRR characteristics of the supplied bias voltage.

Various Notes & Examples

In Example 1, a cascaded power supply system can include a switched-mode DC-to-DC power converter and a linear regulator circuit. The DC-to-DC power converter can include an input voltage node, a first stage output voltage node, and a bootstrapped floating bias voltage node. The linear regulator can include an n-channel field-effect transistor (NFET) pass transistor and a gate driver circuit. The NFET pas transistor can include a drain terminal coupled to the first stage output voltage node, a gate terminal, and a source terminal configured to provide a second-stage output voltage. The gate driver circuit can include a driver output coupled to the gate terminal of the NFET pass transistor, and a high side supply node configured to receive a bias voltage generated from the bootstrapped floating bias voltage node.

In example 2, the system of Example 1 optionally includes a rectifying circuit located between the bootstrapped floating bias voltage node and the high side supply node.

In Example 3, the rectifying circuit of any one or more of Examples 1-2 optionally is configured to reference the bias voltage to a low side supply node of the gate driver circuit.

In Example 4, the rectifying circuit of any one or more of Examples 1-3 optionally includes an output linear regulator configured to provide the bias voltage.

In Example 5, the rectifying circuit of any one or more of Examples 1-4 optionally includes a diode coupled to the bootstrapped floating bias voltage node, and a capacitor coupled in series with the diode to ground.

In Example 6, a bias generator configured to provide a bias voltage for an n-channel based linear regulator can include bootstrap circuitry configured to receive an input voltage (VIN) and to provide a supply voltage (VDD) for the n-channel based linear regulator, and a bias voltage circuit coupled to an intermediate node of the bootstrap circuitry, the bias voltage circuit configured to provide the bias voltage (Vbias) to a gate driver of the NMOS linear regulator.

In Example 7, the bias voltage circuit of any one or more of Examples 1-6 optionally includes a diode coupled to the intermediate node and a capacitor coupled in series with the diode to ground.

In Example 8, the bias voltage circuit of any one or more of Examples 1-7 optionally includes an output linear regulator having an input coupled to the diode and to the capacitor and configured to provide the bias voltage.

In Example 9, the bootstrap circuitry of any one or more of Examples 1-8 optionally includes an inductor, a first switch configured to couple a first node of the inductor with the input voltage in a first state of the first switch and to isolate the first node of the inductor from the input voltage in a second state of the first switch, a bootstrap diode coupled between the intermediate node and the input voltage, and a bootstrap capacitor coupled between the intermediate node and the first node of the inductor.

In Example 10, the bootstrap circuitry of any one or more of Examples 1-9 optionally includes a second switch configured to couple the first node of the inductor to ground in a first state of the second switch and to isolate the first node of the inductor from ground in a second state of the second switch.

In Example 11, the bias voltage (Vbias) of any one or more of Examples 1-10 optionally is greater than the input voltage (VIN).

In Example 12, a maximum voltage of the intermediate node of any one or more of Examples 1-11 optionally is about two times the input voltage (VIN) minus a forward bias voltage of the diode.

In Example 13, an average of the bias voltage (Vbias) of any one or more of Examples 1-12 optionally is about two times the input voltage (VIN) minus two times a forward bias voltage (VD) of the diode, Vbias=2VIN−2VD.

In Example 14, a method for providing a bias voltage (Vbias) for an n-channel based linear regulator can include receiving an input voltage (VIN) at bootstrap circuitry of a switched-mode voltage converter, providing a supply voltage (VDD) for the n-channel based linear regulator at an output of the switched-mode voltage converter, and providing the bias voltage (Vbias) to a gate driver of the n-channel based linear regulator using a bias voltage circuit coupled to an intermediate node of the bootstrap circuitry.

In Example 15, the method of any one or more of Examples 1-14 optionally includes transferring charge from a bootstrap capacitor of the bootstrap circuitry via a diode of the bias voltage circuit.

In Example 16, the method of any one or more of Examples 1-15 optionally includes accumulating the charge in a capacitor of the bias voltage circuit.

In Example 17, the method of any one or more of Examples 1-16 optionally includes receiving a voltage across the capacitor of the bias voltage circuit at an output linear regulator of the bias voltage circuit and providing the bias voltage at an output of the output linear regulator.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods.

The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claims are as follows:

1. A cascaded power supply system, comprising:
   a switched-mode DC-to-DC power converter, including an input voltage node, and a first stage output voltage node;
   a bootstrap circuit including a bootstrap, first diode coupled to a bootstrap capacitor at an intermediate node, the bootstrap capacitor coupled between the intermediate node and a switch node of the switched mode DC-to-DC power converter; and
   a linear regulator circuit, including:
   an n-channel field-effect transistor (NFET) pass transistor, including a drain terminal coupled to the first stage output voltage node, a gate terminal, and a source terminal configured to provide a second-stage output voltage; and
   a gate driver circuit, including a driver output coupled to the gate terminal of the NFET pass transistor, and a high side supply node configured to receive a bias voltage generated from the intermediate node via a second diode.

2. The system of claim 1, comprising:
   a rectifying circuit, located between the intermediate node and the high side supply node.

3. The system of claim 2, wherein the rectifying circuit is configured to reference the bias voltage to a low side supply node of the gate driver circuit.

4. The system of claim 2, wherein the rectifying circuit includes an output linear regulator configured to provide the bias voltage.

5. The system of claim 2, wherein the rectifying circuit includes:
   the second diode coupled between the intermediate node and the gate driver circuit; and
   a second capacitor coupled to the second diode and to ground.

6. A bias generator configured to provide a bias voltage for an n-channel based linear regulator cascaded with a switched power converter, the switched power converter configured to provide an input voltage ($V_{DD}$) of the linear regulator, the bias generator comprising:
   bootstrap circuitry including a bootstrap, first diode coupled to a bootstrap capacitor at an intermediate node, the bootstrap circuitry configured to receive an input voltage ($V_{IN}$) of the switched power converter and to provide a supply voltage for a high-side driver of the switched power converter; and
   a bias voltage circuit coupled to an intermediate node of the bootstrap circuitry, the bias voltage circuit configured to provide the bias voltage ($V_{bias}$) to a gate driver of the NMOS linear regulator, wherein the bias voltage circuit includes:
   a second diode coupled directly to the intermediate node; and
   a capacitor coupled to the second diode and to ground.

7. The bias generator of claim 6, wherein the bias voltage circuit includes an output linear regulator having an input coupled to the second diode and to the capacitor and configured to provide the bias voltage.

8. The bias generator of claim 6, wherein the bootstrap circuitry includes:
   an inductor;
   a first switch configured to couple a first node of the inductor with the input voltage in a first state of the first switch and to isolate the first node of the inductor from the input voltage in a second state of the first switch;
   the bootstrap, first diode coupled between the intermediate node and the input voltage; and
   the bootstrap capacitor coupled between the intermediate node and the first node of the inductor.

9. The bias generator of claim 8, wherein the bootstrap circuitry includes:
   a second switch configured to couple the first node of the inductor to ground in a first state of the second switch and to isolate the first node of the inductor from ground in a second state of the second switch.

10. The bias generator of claim 6, wherein the bias voltage ($V_{bias}$) is greater than the input voltage ($V_{IN}$).

11. The bias generator of claim 6, wherein a maximum voltage of the intermediate node is about two times the input voltage ($V_{IN}$) minus a forward bias voltage of the second diode.

12. The bias generator of claim 6, wherein an average of the bias voltage ($V_{bias}$) is about two times the input voltage ($V_{IN}$) minus two times a forward bias voltage ($V_D$) of the second diode,
$V_{bias} = 2V_{IN} - 2V_D$.

13. A method for providing a bias voltage ($V_{bias}$) for an n-channel based linear regulator, the method comprising:
   receiving an input voltage ($V_{IN}$) at bootstrap circuitry of a switched-mode voltage converter;
   charging a bootstrap capacitor during a first state of the switch-mode power converter via a bootstrap, first diode, the bootstrap, first diode coupled to the intermediate node and the input voltage ($V_{in}$);
   providing a supply voltage ($V_{DD}$) for the n-channel based linear regulator at an output of the switched-mode voltage converter; and
   providing the bias voltage (Vbias) to a gate driver of the n-channel based linear regulator via a second diode of a bias voltage circuit, the second diode coupled between the intermediate node of the bootstrap circuitry and a supply input of the gate driver.

14. The method of claim 13, including transferring charge from a bootstrap capacitor of the bootstrap circuitry via the second diode during a second state of the switched-mode voltage converter.

15. The method of claim 13, including boosting a voltage level of the bootstrap capacitor during a second state of the switch-mode power converter.

16. The method of claim 15, including transferring charge from a bootstrap capacitor of the bootstrap circuitry via the second diode during the second state.

* * * * *